(12) United States Patent
Wu

(10) Patent No.: US 7,548,458 B2
(45) Date of Patent: Jun. 16, 2009

(54) METHODS OF BIASING A MULTI-LEVEL-CELL MEMORY

(75) Inventor: Chao-I Wu, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 245 days.

(21) Appl. No.: 11/741,045

(22) Filed: Apr. 27, 2007

(65) Prior Publication Data

US 2008/0266979 A1    Oct. 30, 2008

(51) Int. Cl.
*G11C 11/34* (2006.01)
(52) U.S. Cl. .............................. 365/185.03; 365/185.18
(58) Field of Classification Search ............. 365/185.03, 365/185.17, 185.18, 185.29
See application file for complete search history.

(56) References Cited

U.S. PATENT DOCUMENTS

| | | | |
|---|---|---|---|
| 6,011,725 A | 1/2000 | Eitan et al. | |
| 7,405,969 B2 * | 7/2008 | Eitan ..................... | 365/185.03 |
| 7,476,927 B2 * | 1/2009 | Bhattacharyya ............. | 257/314 |
| 2008/0205140 A1 * | 8/2008 | Lee et al. ............... | 365/185.03 |

OTHER PUBLICATIONS

Yeh, C.C., et al., "PHINES: A Novel Low Power Program/Erase, Small Pitch, 2-Bit per Cell Flash Memory," IEDM Tech. Dig. 2002, 931-934.
Ito et al., "A Novel MNOS Techology Using Gate Hole Injection in Erase Operation for Embedded Nonvolatile Memory Applications," 2004 Symp. on VLSI Tech Digest of Tech Papers 2004, 80-81.

* cited by examiner

*Primary Examiner*—Anh Phung
(74) *Attorney, Agent, or Firm*—Haynes Beffel & Wolfeld LLP

(57) ABSTRACT

Methods are described for double-side-bias of multi-level-cell memory devices comprising a NAND array that comprises a plurality of charge trapping memory cells. A memory device is programmed by a double-side-bias electron injection technique and is erased by a double-side-bias hole injection technique. Each charge trapping memory cell includes $2^n$ logic states, such as four binary logic states of a logic 00 state, a logic 01 state, a logic 10 state and a logic 11 state. The memory device can be programmed by a double-side-bias multi-level-cell program method either with a variable DSB (Vd/Vs) voltage or with a variable gate bias voltage Vg.

18 Claims, 12 Drawing Sheets

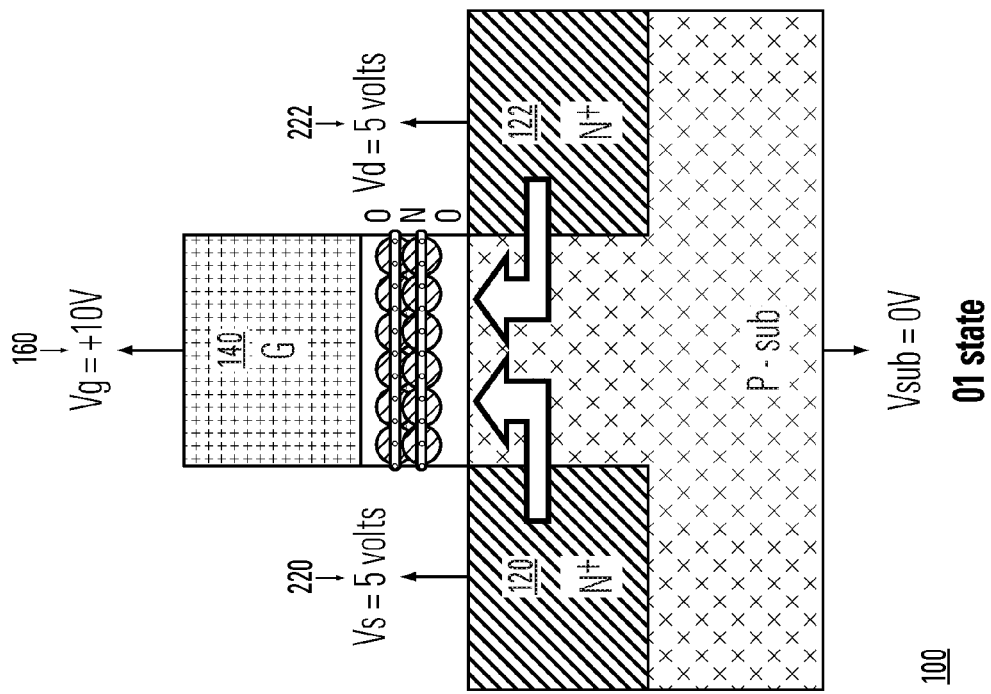
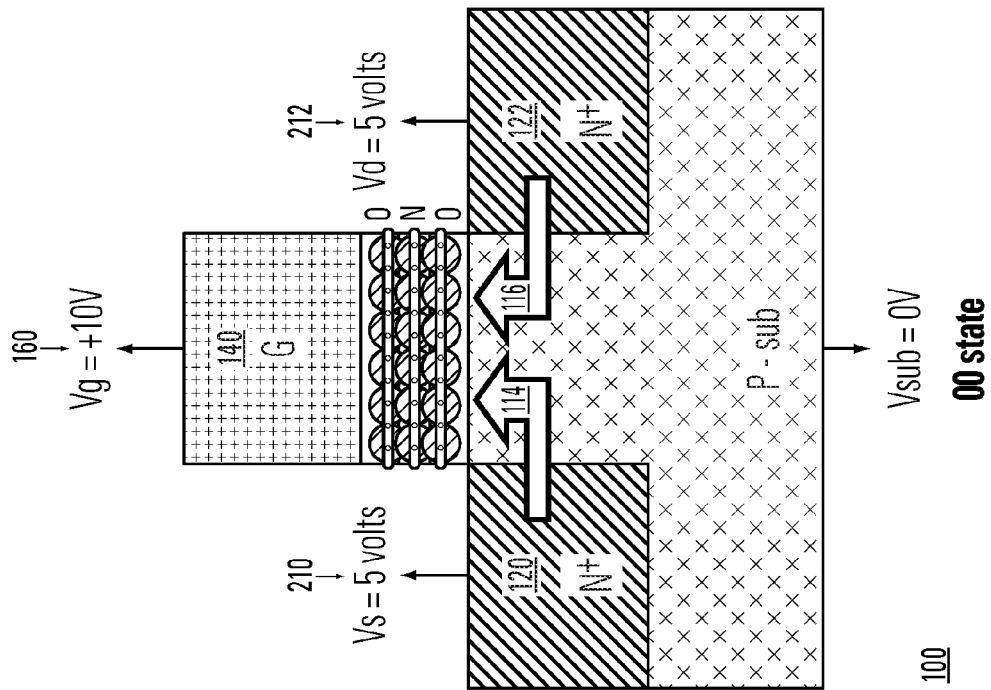

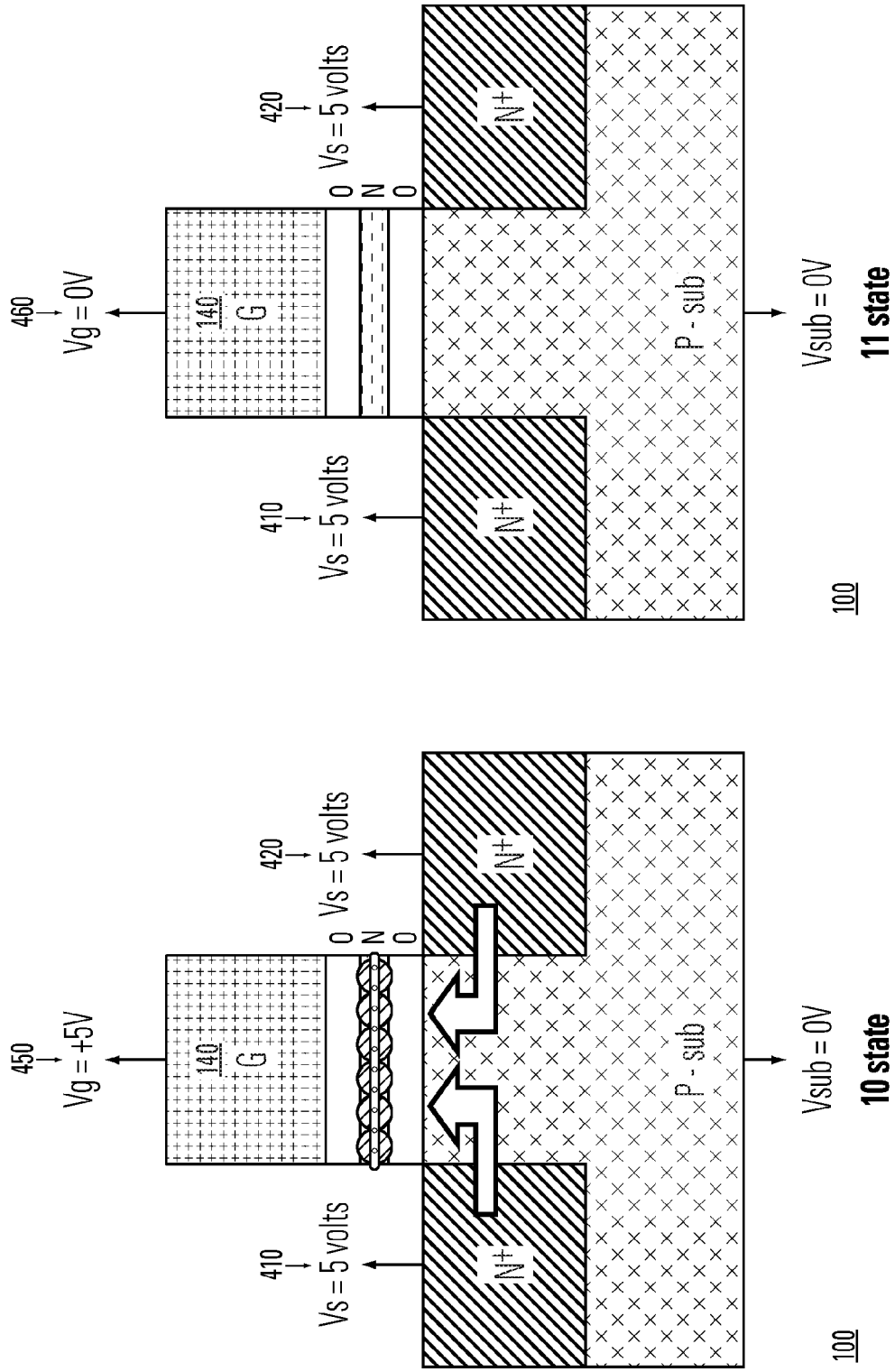

METHODS OF BIASING A MULTI-LEVEL-CELL MEMORY

BACKGROUND OF THE INVENTION

1. Field of the Invention

The present invention relates generally to electrically programmable and erasable memory and more particularly to programming and erasing of a charge trapping memory array.

2. Description of Related Art

Electrically programmable and erasable nonvolatile memory technologies based on charge storage structures known as Electrically Erasable Programmable Read-Only Memory (EEPROM) and flash memory are used in a variety of modern applications. A flash memory is designed with an array of memory cells that can be independently programmed and read. Sense amplifiers in a flash memory are used to determine the data value or values stored in a nonvolatile memory. In a typical sensing scheme, an electrical current through the memory cell being sensed is compared to a reference current by a current sense amplifier.

A number of memory cell structures are used for EEPROMs and flash memories. As the dimensions of integrated circuits shrink, greater interest is arising in memory cell structures based on charge trapping dielectric layers, because of the scalability and simplicity of the manufacturing processes. Memory cell structures based on charge trapping dielectric layers include structures known as N-bit memory. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

N-bit devices use a relatively thick bottom oxide, e.g. greater than 3 nanometers, and typically about 5 to 9 nanometers, to prevent charge loss. Instead of direct tunneling, band-to-band tunneling-induced hot hole injection BTBTHH can be used to erase the cell. However, the hot hole injection causes oxide damage, leading to charge loss in the high threshold cell and charge gain in the low threshold cell. Moreover, the erase time must be increased gradually during program and erase cycling due to the hard-to-erase accumulation of charge in the charge trapping structure. This accumulation of charge occurs because the hole injection point and electron injection point do not coincide with each other, and some electrons remain after the erase pulse. In addition, during the sector erase of an N-bit flash memory device, the erase speed for each cell is different because of process variations (such as channel length variation). This difference in erase speed results in a large Vt distribution of the erase state, where some of the cells become hard to erase and some of them are over-erased. Thus the target threshold Vt window is closed after many program and erase cycles and poor endurance is observed. This phenomenon will become more serious as the technology continues scaling down.

A traditional floating gate device stores 1 bit of charge in a conductive floating gate. N-bit devices have a plurality of cells where each N-bit cell provides two bits of flash cells that store charge in an Oxide-Nitride-Oxide (ONO) dielectric. In a typical structure of an N-bit memory cell, a nitride layer is used as a trapping material positioned between a top oxide layer and a bottom oxide layer. The ONO layer structure effectively replaces the gate dielectric in floating gate devices. The charge in the ONO dielectric with a nitride layer may be either trapped on the left side or the right side of an N-bit cell.

Conventional program and erase techniques employ a channel hot electron method for programming and a band-to-band tunneling-induced hot hole method for erasing. It is desirable to provide more efficient methods for programming and erasing nonvolatile memory.

SUMMARY OF THE INVENTION

Methods are described for double-side-bias (DSB) of multi-level-cell (MLC) memory devices comprising a NAND array that comprises a plurality of charge trapping memory cells. A memory device is programmed by a double-side-bias electron-injection (EI) technique and erased by a double-side-bias hole-injection (HI) technique. Each charge trapping memory cell includes $2^n$ logic states, such as four binary logic (or multi-level-cell) states of a logic 00 state, a logic 01 state, a logic 10 state and a logic 11 state. The memory device can be programmed by a double-side-bias multi-level-cell program method either with a variable DSB (Vd/Vs) voltage or with a variable gate bias voltage Vg.

In a first double-side-bias multi-level-cell program method, a different DSB voltage value is applied to a different logic state while the gate voltage remains constant. For example, the gate voltage Vg supplies 10 volts to the gate terminal for each charge trapping memory cell in the memory device. In the logic 00 state, the source region and the drain region of a charge trapping memory cell are biased simultaneously (i.e., double-side-bias) with a first bias arrangement with a source voltage Vs supplying 5 volts to the source region and a drain voltage Vd supplying 5 volts to the drain region. In the logic 01 state, the source region and the drain region of a charge trapping memory cell are biased simultaneously with a second bias arrangement with the source voltage Vs supplying 4.5 volts to the source region and the drain voltage Vd supplying 4.5 volts to the drain region. In the logic 10 state, the source region and the drain region of a charge trapping memory cell are biased simultaneously with a third bias arrangement with the source voltage Vs supplying 4 volts to the source region and the drain voltage Vd supplying 4 volts to the drain region. In the logic 11 state, the charge trapping memory cell is not being programmed where the source voltage Vs has zero volts and the drain voltage has zero volts.

In a second double-side-bias multi-level-cell program method, a different gate bias voltage Vg is applied to a different logic state while the DSB (Vd/Vs) voltages remain constant. In this illustration, the source voltage and the drain voltage have the same voltage value, e.g. 5 volts, where the source voltage supplies 5 volts to the source region of the charge trapping memory cell simultaneously with the drain voltage supplying 5 volts to the drain region of the charge trapping memory cell. In the logic 00 state, the charge memory cell is in a first bias arrangement where the gate voltage Vg supplies 15 volts to the gate terminal of the charge trapping memory cell while the source region and the drain region are biased simultaneously by supplying 5 volts from the source voltage Vs to the source region and 5 volts from the drain voltage Vg to the drain region. In the logic 01 state, the charge memory cell is in a second bias arrangement where the gate voltage Vg supplies 10 volts to the gate terminal of the charge trapping memory cell while the source region and the drain region are biased simultaneously by supplying 5 volts from the source voltage Vs to the source region and 5 volts from the drain voltage Vg to the drain region. In the logic 10 state, the charge memory cell is in a third bias arrangement where the gate voltage Vg supplies 5 volts to the gate terminal of the charge trapping memory cell while the source region and the drain region are biased simultaneously by supplying 5 volts from the source voltage Vs to the source region and 5 volts from the drain voltage Vg to the drain region. In the logic 11 state, the charge memory cell is not being programmed such that the gate voltage Vg has zero volts, while the source region and the drain region are biased simultaneously by supplying 5 volts from the source voltage Vs to the source region and 5 volts from the drain voltage Vg to the drain region.

One of the double-side-bias multi-level-cell program methods described can be applied to a charge trapping memory device such as a NAND memory array. Charge trapping memory cells in the NAND memory array are programmed in parallel. After the programming step, as a first step in the double-side-bias multi-level-cell bit-by-bit erase operation, the NAND memory array is checked to detect any bit in a charge trapping memory cell that has been over-programmed. For a bit or bits in the charge trapping memory cell that have been detected to have been over-programmed, a double-side-bias multi-level-cell erase operation is conducted on a bit-by-bit basis.

In a second step, the bit that has been determined to have been over-programmed is erased by a double-side-bias hole-injection method, or if more than one bit has been determined to have been over-programmed, the over-programmed bits are erased by the double-side-bias hole-injection method. In a third step, the bit (or bits) that has been over-programmed, and now erased, is reprogrammed to a selected logic state.

Broadly stated, a method for double side biasing a multi-level-cell memory device having a plurality of charge trapping memory cells in a NAND memory array, each charge trapping memory cell in the plurality of charge trapping memory cells having $2^n$ logic states including a first logic state, a second logic state, a third logic state and a fourth logic state, each charge trapping memory cell having a first charge trapping site for storing a first bit and a second charge trapping site for storing a second bit, comprises programming the plurality of charge trapping memory cells by simultaneously biasing a respective source terminal and a respective drain terminal in each of the plurality of charge trapping memory cells and applying a gate voltage to a respective terminal in each of the plurality of charge trapping memory cells; and determining a bit (or bits) in each of the plurality of charge trapping memory cells that has been over-programmed by reading a voltage value of the bit and comparing that value to a reference voltage value, the over-programmed bit having a source terminal, a drain terminal and a gate terminal; and erasing the over-programmed bit by biasing simultaneously the source terminal and the drain terminal of the over-programmed bit, and biasing the gate terminal of the over-programmed bit with a positive gate voltage.

Advantageously, the double-side-bias erase operation can be used to emulate plus and minus Fowler-Nordheim operations with lower bias voltage and a faster operational speed. Variable DSB (Vd/Vs) voltages with a fixed gate voltage produce a program efficiency suitable for multi-level-cell applications. A variable gate voltage with fixed DSB voltages also produces a program efficiency suitable for multi-level-cell applications. The DSB methods provide a flexible erase capability so that the voltage threshold Vt levels of DSB MLC can be corrected by a bit-by-bit erase operation rather than a sector erase operation.

The structures and methods of the present invention are disclosed in the detailed description below. This summary does not purport to define the invention. The invention is defined by the claims. These and other embodiments, features, aspects, and advantages of the invention will become better understood when read in conjunction with the following description, appended claims and accompanying drawings.

BRIEF DESCRIPTION OF THE DRAWINGS

The invention will be described with respect to specific embodiments thereof, and reference will be made to the drawings, in which:

FIGS. 2A-2D are process diagrams illustrating a first method embodiment in conducting a program operation using a double-side-bias electron injection of the four binary states in a multi-level-cell memory in accordance with the present invention.

FIGS. 4A-4D are process diagrams illustrating a second method embodiment for conducting a program operation by a double-side-bias electron injection method of the four binary states in the charge trapping memory cell in accordance with the present invention.

DETAILED DESCRIPTION

Figure 1:
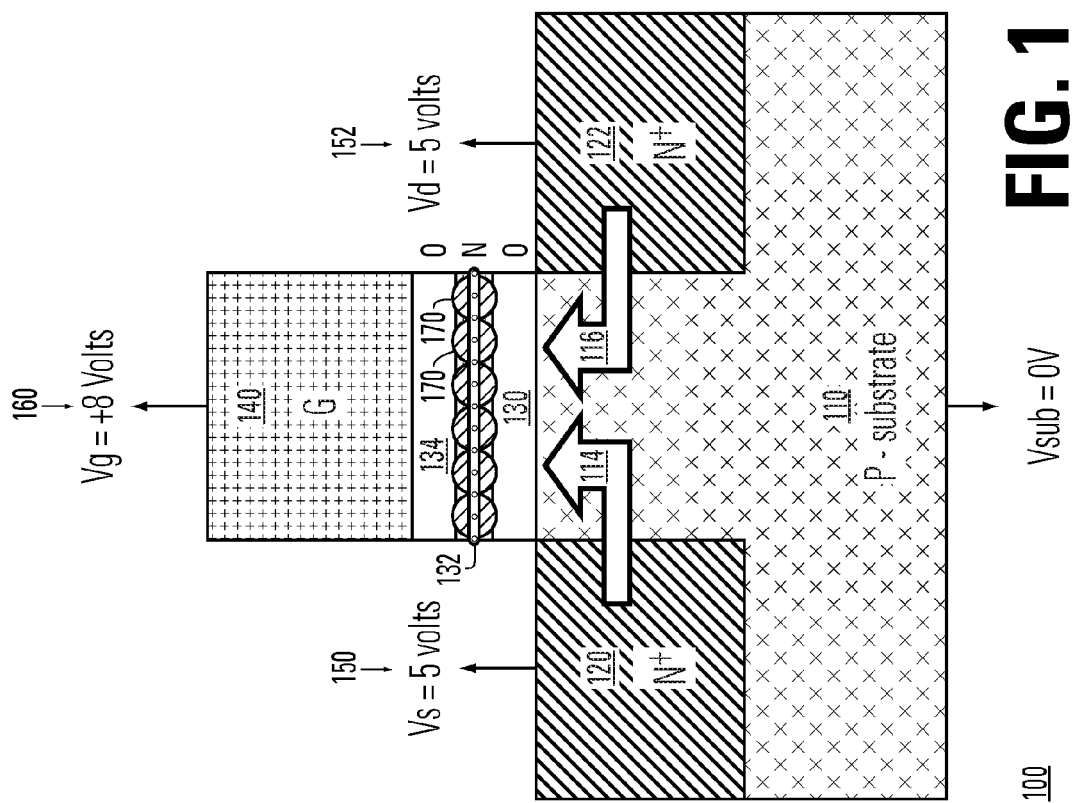
FIG. 1 is a process diagram illustrating a cross-sectional view of conducting a program operation using a double-side-bias electron injection method of the memory in accordance with the present invention.

A description of structural embodiments and methods of the present invention is provided with reference to FIGS. 1-10. It is to be understood that there is no intention to limit the invention to the specifically disclosed embodiments, but that the invention may be practiced using other features, elements, methods and embodiments. Like elements in various embodiments are commonly referred to with like reference numerals.

FIG. 1 is a process diagram illustrating a cross-sectional view of programming a charge trapping memory cell (or N-bit) 100 by using a double-side-bias (DSB) electron injection (EI) method. The charge trapping memory cell 100 comprises a p-substrate 110 with n+ doped regions 120 and 122, and a p-doped region between the n+ doped regions 120 and 122. A first directional flow 114 indicates the flow of hole charges from the n+ doped region 120, and a second directional flow 116 indicates the flow of hole charges from the n+ doped region 122. A channel width X 112 of the p-substrate 110 is positioned between the n+ doped region 120 on the left end and the n+ doped region 122 on the right end. A bottom dielectric structure 130 (bottom oxide) overlays a top surface of the channel width X 112 of the p-substrate 110. A charge trapping structure 132 (e.g. silicon nitride layer) overlays the bottom dielectric structure 130. A top dielectric structure (top oxide) 134 overlays the charge trapping structure 132. A polygate 140 overlays the top dielectric structure 134. The combination of the bottom dielectric structure 130, the charge trapping structure 132, and the top dielectric structure 134 is commonly referred as an ONO (oxide-nitride-oxide) structure. The width of the ONO structure, typically but not necessarily, aligns with the channel width X 112 of the p-substrate 110. The charge trapping memory cell 100 comprises a first charge trapping site 180 in the charge trapping structure 132, such as on the left side of the charge trapping structure 132 for storing one or more bits, and a second charge trapping site 182 in the charge trapping structure 132, such as on the right side of the charge trapping structure 132 for storing one or more bits. Representative top dielectrics include silicon dioxide and silicon oxynitride, or other similar high dielectric constant materials including for example $Al_2O_3$, having a thickness of about 5 to 10 nanometers. Representative bottom dielectrics include silicon dioxide and silicon oxynitride, or other similar high dielectric constant materials, having a thickness of about 3 to 10 nanometers. Representative charge trapping structures include silicon nitride, or other similar high dielectric constant materials, including metal oxides such as $Al_2O_3$, $HfO_2$, $CeO_2$, and others, having a thickness of about 3 to 9 nanometers. The charge trapping structure may be a discontinuous set of pockets or particles of charge trapping material, or a continuous layer as shown in the drawing.

The memory cell for N-bit-like cells has, for example, a bottom oxide with a thickness ranging from 3 nanometers to 10 nanometers, a charge trapping layer with a thickness ranging from 3 nanometers to 9 nanometers, and a top oxide with a thickness ranging from 5 nanometers to 10 nanometers. The memory cell for SONOS-like cells has, for example, a bottom oxide with a thickness ranging from 1 nanometer to 3 nanometers, a charge trapping layer with a thickness ranging from 3 nanometers to 9 nanometers, and a top oxide with a thickness ranging from 3 nanometers to 10 nanometers.

As generally used herein, programming refers to raising the threshold voltage of a memory cell and erasing refers to lowering the threshold voltage of a memory cell. However, the invention encompasses both products and methods where programming refers to raising the threshold voltage of a memory cell and erasing refers to lowering the threshold voltage of a memory cell, and products and methods where programming refers to lowering the threshold voltage of a memory cell and erase refers to raising the threshold voltage of a memory cell.

The charge trapping memory cell 100 is double-side-biased in the n+ doped regions 120 and 122, which can also be referred to as the source region 120 and the drain region 122. The term "double-side-bias" refers to biasing the source region 120 and the drain region 122 simultaneously. The term "simultaneously" as used in this application is to be interpreted broadly, including operating at the same time, overlapping, concurrent, in parallel, or around the same time. The bias voltage applied to the source region 120 and the drain region 122 can be the same voltage or a different voltage. In this embodiment, the same voltage of 5 volts is applied to the source region 120 and the drain region 122, so the figure shows a source voltage Vs 150 of 5 volts applied to the source region 120 and a drain voltage Vd 152 of 5 volts applied to the drain region 122.

The double-side-bias is applied to the charge trapping cell 100 by applying the same amount of voltage to the source region 120 and the drain region 122. The source voltage Vs 150 of 5 volts is applied to the source region 120. A first directional flow 114 indicates the flow of electron charges from the n+ doped region 120, and a second directional flow 116 indicates the flow? of hole charges from the n+ doped region 122. The drain voltage Vd 152 of 5 volts is applied to the drain region 122. In an electron-injection method, a positive gate voltage+Vg 160 of +8 volts is applied to the polygate 140 to enhance the electron injection efficiency. Electron charges 170 can be generated with a junction voltage, which is used to control electron generation efficiency.

Figure 2C:
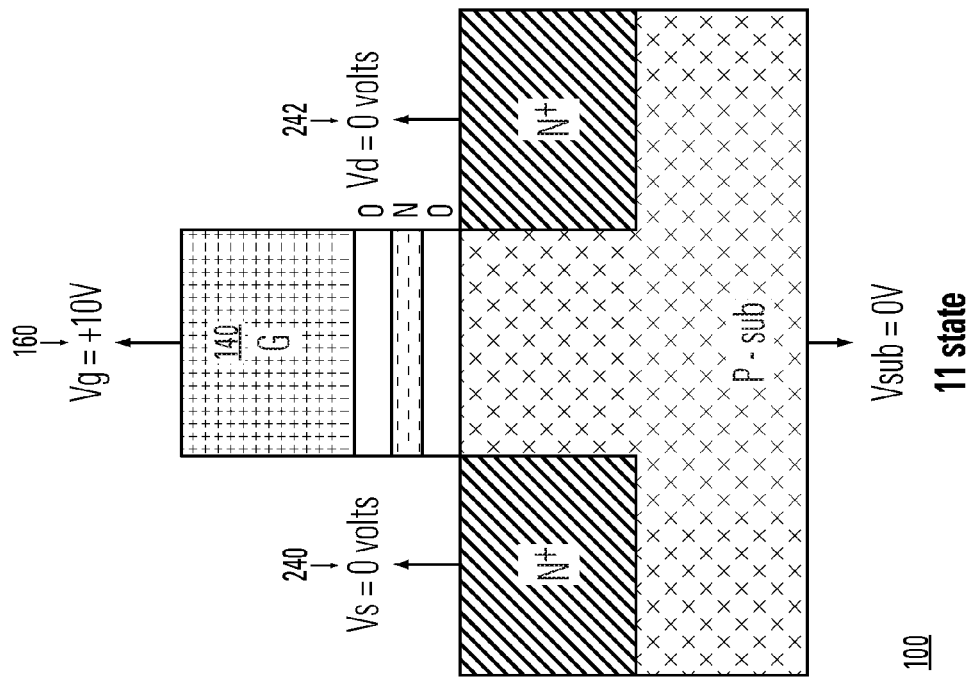
Figure 2D:
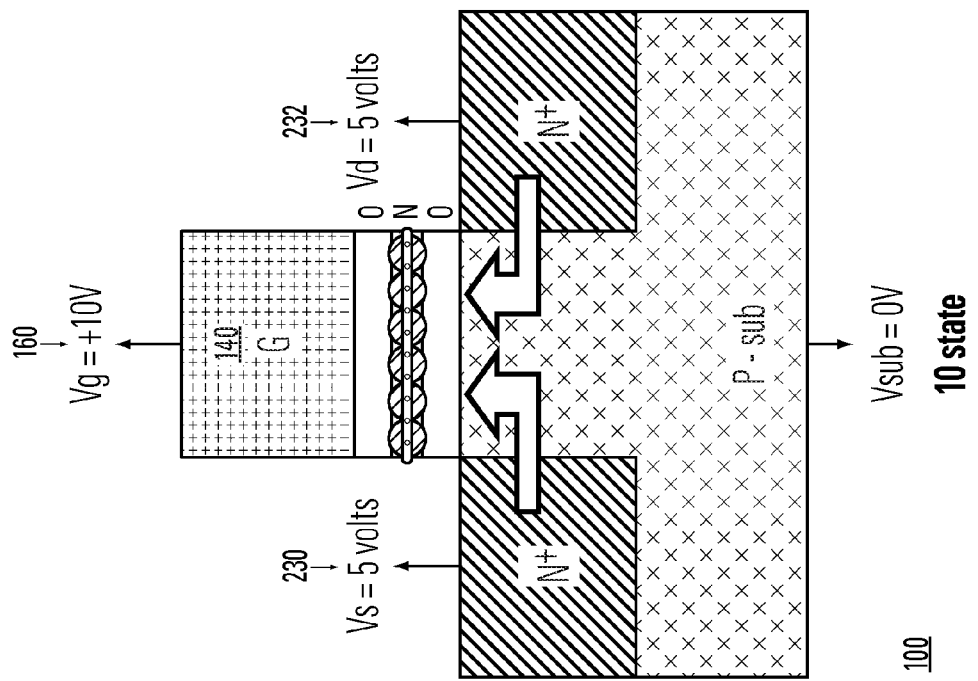

FIGS. 2A-2D are process diagrams illustrating a first method embodiment for conducting a program operation using double-side-bias electron injection of the four binary states in a multi-level-cell (MLC) memory, such as the charge trapping memory cell 100. Each diagram in FIGS. 2A-2D represents a different logic state such that FIG. 2A illustrates a logic 00 state, FIG. 2B illustrates a logic 01 state, FIG. 2C illustrates a logic 10 state, and FIG. 2D illustrates a logic 11 state. In the first method, a gate voltage Vg is a fixed voltage value. The electron quantity determines which logic state is controlled by different double-side bias voltages (Vd/Vs), which produces a different level of electron quantity.

In this embodiment, the gate voltage Vg is set to 10 volts for all four binary states. FIG. 2A shows the double-side-bias voltages applied to the charge trapping memory cell 100 to place the charge trapping memory cell 100 in the logic 00 state. A source voltage Vs 210 of 5 volts is applied to the source region 120. A drain voltage Vd 212 of 5 volts is applied to the drain region 122.

Different double-side-bias voltages are applied to attain the other logic states. FIG. 2B shows the double-side-bias voltages applied to the charge trapping memory cell 100 to place the charge trapping memory cell 100 in the logic 01 state. A source voltage Vs 220 of 4.5 volts is applied to the source region 120. A drain voltage Vd 222 of 4.5 volts is applied to the drain region 122. The gate voltage Vg 160 remains fixed at 10 volts.

In FIG. 2C, there is shown the double-side-bias voltages being applied to the charge trapping memory cell 100 to place the charge trapping memory cell 100 in the logic 10 state. A source voltage Vs 230 of 4.0 volts is applied to the source region 120. A drain voltage Vd 232 of 4.0 volts is applied to the drain region 122. The gate voltage Vg 160 remains fixed at 10 volts.

As shown in FIG. 2D, the charge trapping memory 100 is in a logic 11 state, which represents that there is no programming operation to the charge trapping memory cell 100. In the logic 11 state, both the source voltage Vs 240 and the drain voltage 242 are set to about zero volts. The gate voltage Vg 160 remains fixed at 10 volts.

Figure 3:
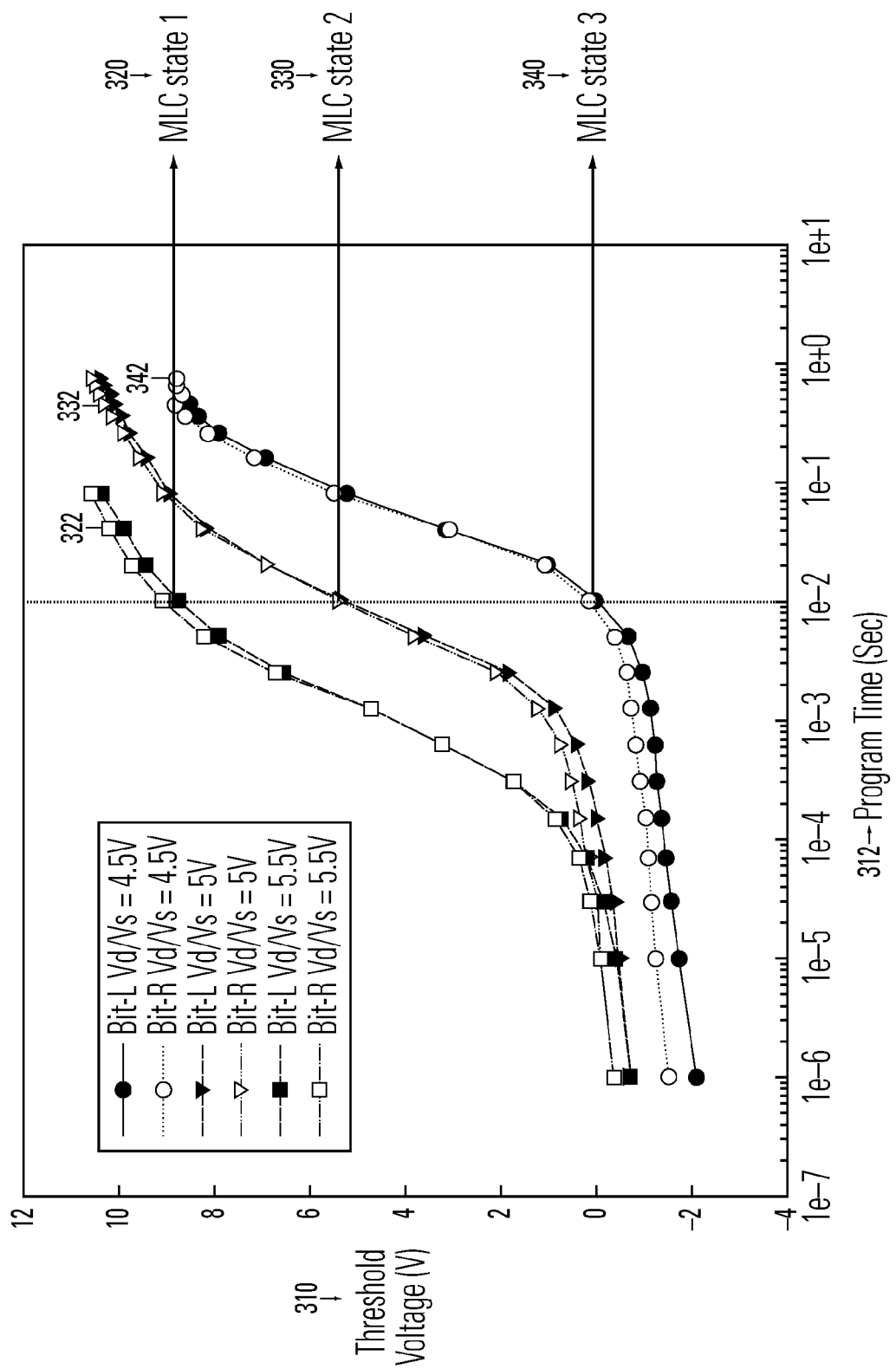
FIG. 3 is a graphical diagram illustrating sample data from the double-side-bias electron injection program of an MLC memory as shown in the first embodiment in accordance with the present invention.

FIG. 3 is a graphical diagram 300 illustrating sample data of the double-side-bias electron-injection programming of the MLC memory in the first embodiment. The graph 300 has a y-axis representing the threshold voltage level 310 and an x-axis representing the programming time 312. A first curve 322 shows the graph characteristics for a first MLC state 320 resulting from applying a drain voltage and a source voltage of 5.5 volts to a left bit (Bit-L or a first bit) and right bit (Bit-R or a second bit) of the charge trapping memory cell 100. A second curve 332 shows the graph characteristics for a second MLC state 330 resulting from applying a drain voltage and a source voltage of 5.0 volts to a left bit and right bit of the charge trapping memory cell 100. A third curve 342 shows the graph characteristics for a third MLC state 340 resulting from applying a drain voltage and a source voltage of 4.5 volts to a left bit and a right bit of the charge trapping memory cell 100.

FIGS. 4A-4D are process diagrams illustrating a second method embodiment for conducting a program operation by a double-side-bias electron injection method of the four binary states in the charge trapping memory cell 100. In this embodiment, the double-side-bias voltages remain about constant such that a source voltage 410 and a drain voltage 420 are set at about the same value. For example, the source voltage 410 is applied with 5 volts to the source region 120 and the drain voltage 420 is applied with 5 volts to the drain region 122. A different electron quantity is controlled by a different gate bias voltage Vg 430.

Figure 4B:
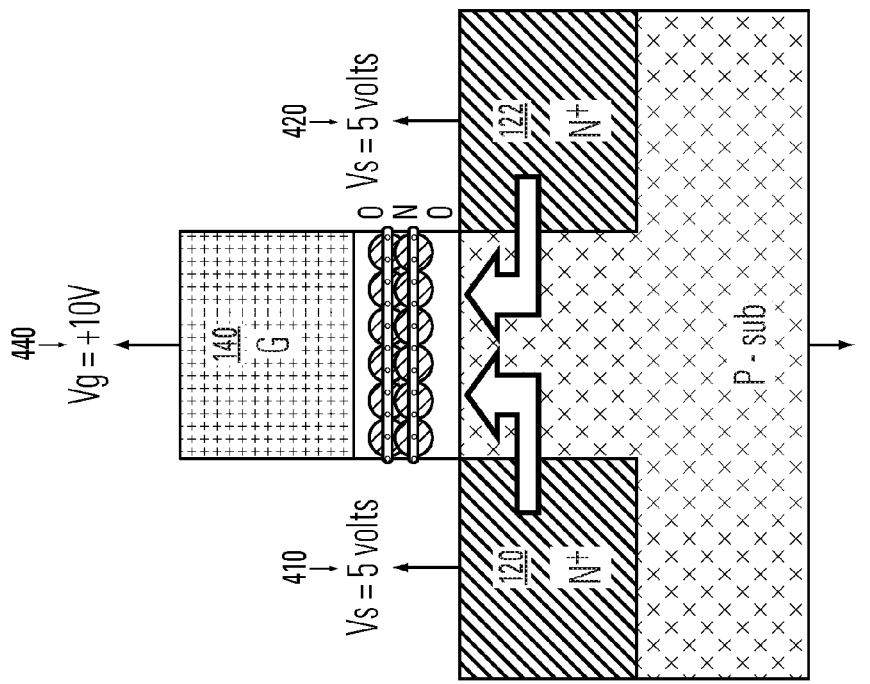
Figure 4A:
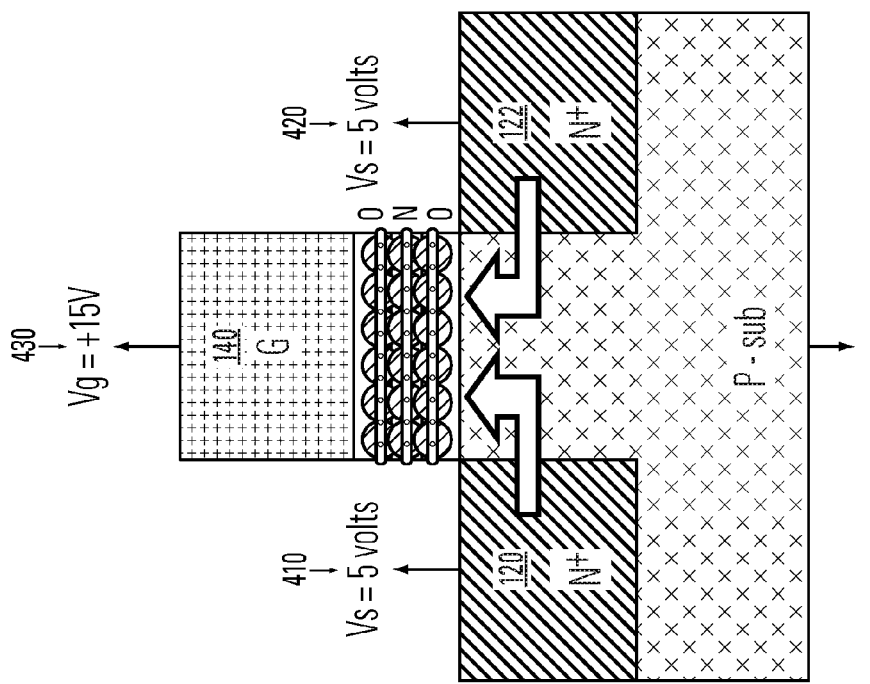

FIG. 4A is a process diagram illustrating the charge trapping memory cell 100 being applied with the double-side-bias voltages to place the charge trapping memory cell 100 in the logic 00 state. A gate voltage Vg 430 of about 15 volts is applied to the gate 140 of the charge trapping memory cell 100 to control the electron quantity. The double-side-bias voltages remain at a constant value, where the source voltage Vs is set to about 5 volts and the drain voltage Vd is set to about 5 volts.

FIG. 4B is a process diagram illustrating the charge trapping memory cell 100 being applied with the double-side-bias voltages to place the charge trapping memory cell 100 in the logic 01 state. A gate voltage Vg 440 of about 10 volts is applied to the gate 140 of the charge trapping memory cell 100 to control the electron quantity. The double-side-bias voltages remain at a constant value, where the source voltage Vs is set to about 5 volts and the drain voltage Vd is set to about 5 volts.

FIG. 4C is a process diagram illustrating the charge trapping memory cell 100 being applied with the double-side-bias voltages to place the charge trapping memory cell 100 in the logic 10 state. A gate voltage Vg 440 of about 5 volts is applied to the gate 140 of the charge trapping memory cell 100 to control the electron quantity. The double-side-bias voltages remain at a constant value, where the source voltage Vs is set to about 5 volts and the drain voltage Vd is set to about 5 volts.

FIG. 4D is a process diagram illustrating the charge trapping memory cell 100 in a logic 11 state, indicating that there is no programming operation applied to the charge trapping memory cell 100. A gate voltage Vg 440 of the charge trapping memory cell 100 is either at zero volts or reset to zero volts. The double-side-bias voltages remain at a constant value, where the source voltage Vs is set to about 5 volts and the drain voltage Vd is set to about 5 volts.

Figure 5:
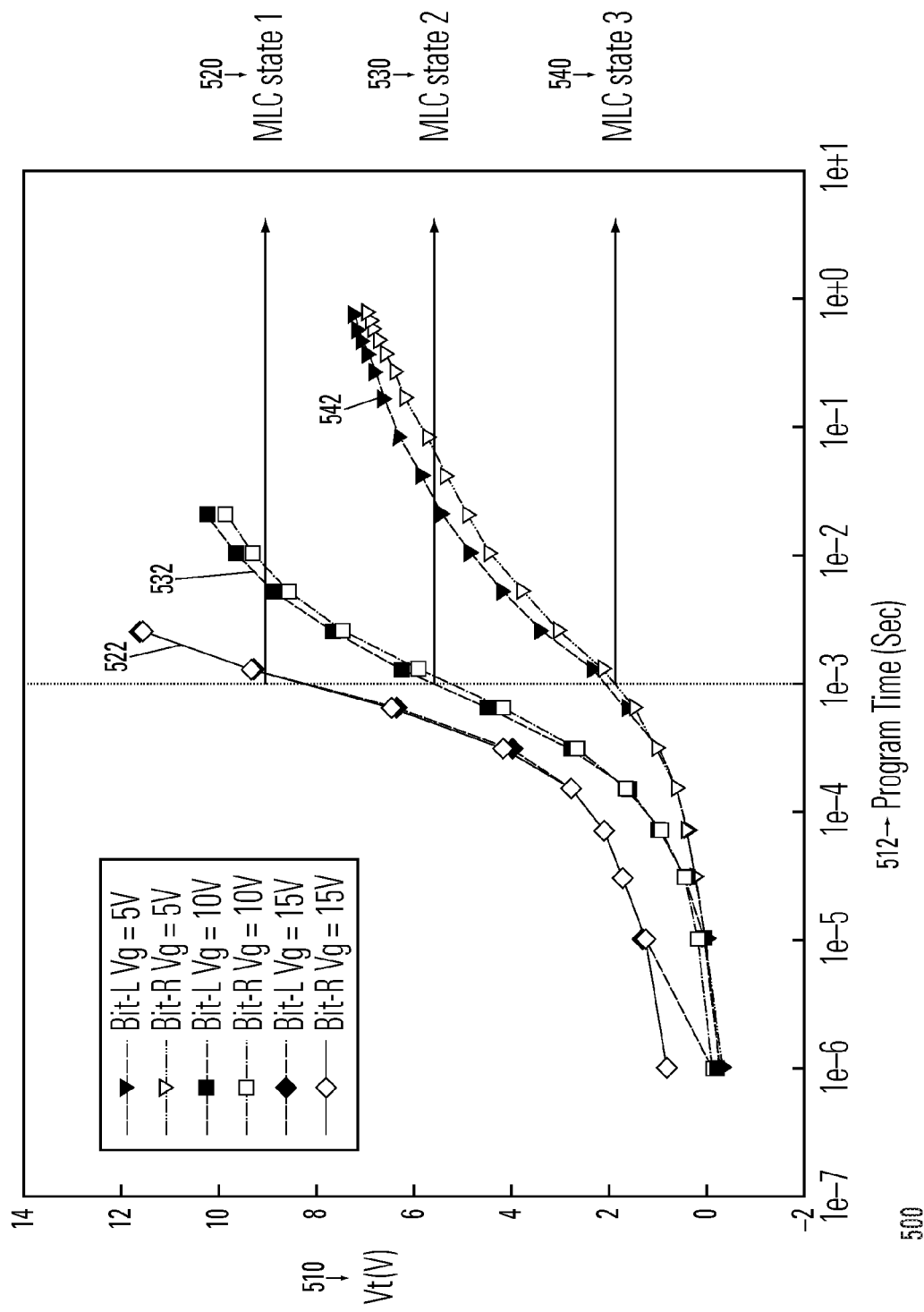
FIG. 5 is a graphical diagram illustrating sample data of the double-side-bias electron-injection program of an MLC memory as shown in the second embodiment in accordance with the present invention.

FIG. 5 is a graphical diagram illustrating sample data of double-side-bias electron injection programming of an MLC memory as shown in the second embodiment. The graph 500 has a y-axis representing the threshold voltage 510 and an x-axis representing the programming time 512. A first curve 522 shows the graph characteristics for a first MLC state 520 resulting from applying a gate voltage of about 15 volts to a left bit and right bit of the charge trapping memory cell 100. A second curve 332 shows the graph characteristics for a second MLC state 530 resulting from applying a gate voltage of about 10 volts to a left bit and right bit of the charge trapping memory cell 100. A third curve 542 shows the graph characteristics for a third MLC state 540 resulting from applying a gate voltage of about 5 volts to a left bit and right bit of the charge trapping memory cell 100.

Figure 6:
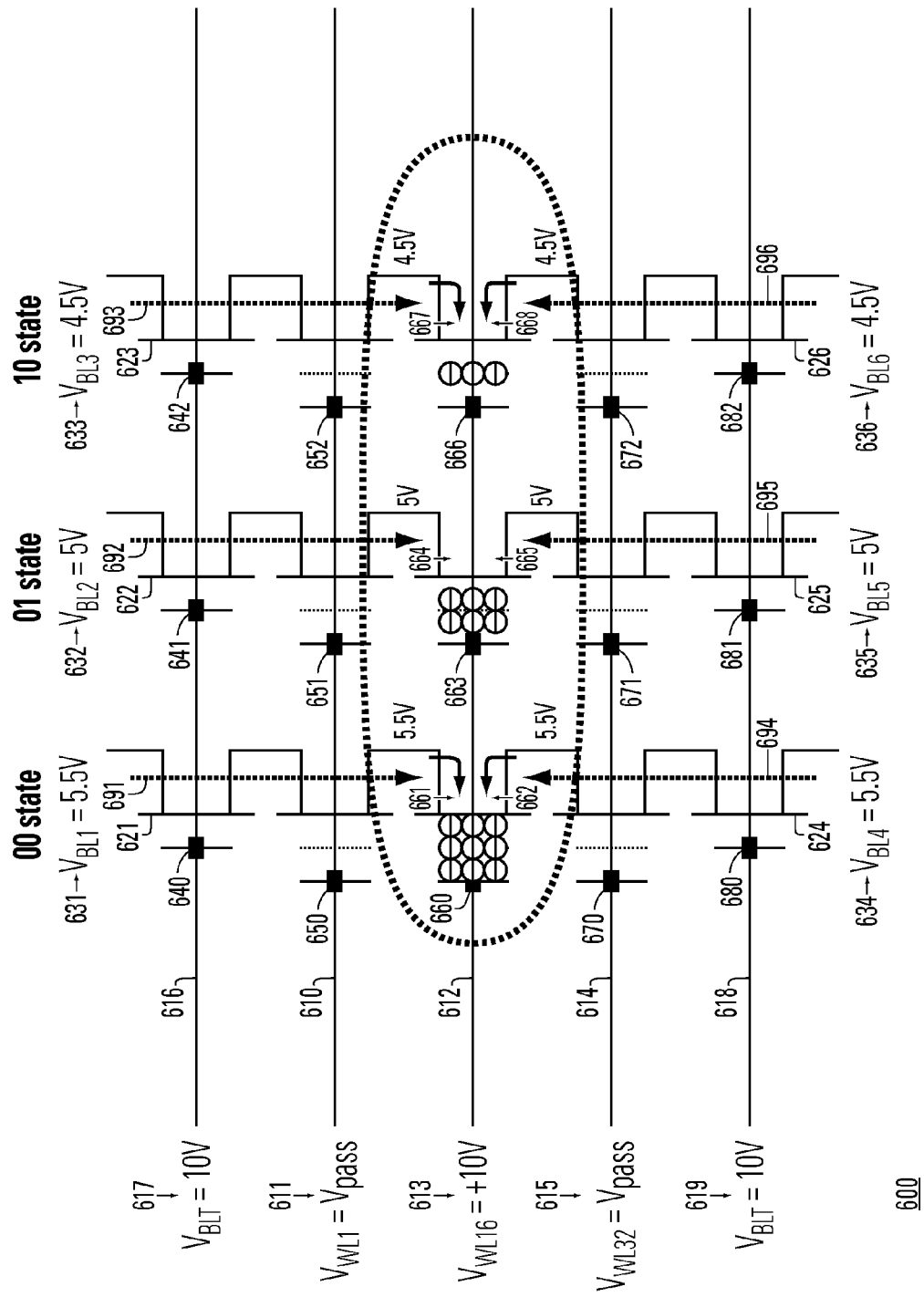
FIG. 6 is a circuit diagram illustrating a DSB-MLC program method of a NAND array in accordance with the present invention.

FIG. 6 is a simplified circuit diagram illustrating a DSB-MLC program method for a NAND array 600. The NAND array 600 includes a plurality of word lines WL1 610, WL16 612, WL32 614, 616, 618 extending in a first or horizontal direction intersecting a plurality of bit lines BL1 621, BL2 622, BL3 623, BL4 624, BL5 625, BL6 626 extending in a second or vertical direction. The NAND array 600 further comprises a plurality of transistors 640-642, 650-652, 660, 663, 666, 670-672, 680-682. The programming of the NAND array 600 can be conducted via a particular word line or by page programming.

In this example, a gate voltage $V_{WL16}$ 613, for example, of 10 volts is applied to the word line 16 (WL16) 612 that is connected to the transistors (or charge trapping memory cells) 660, 663, 666. A double-side-bias multi-cell-level programming is applied the word line 16 to produce multiple logic states, where the transistor 660 is in a logic 00 state, the transistor 663 is in a logic 01 state, and the transistor 666 is in a logic 10 state. Bit line voltages $V_{BL1}$ 631, $V_{BL2}$ 632, $V_{BL3}$ 633, $V_{BL4}$ 634, $V_{BL5}$ 635 and $V_{BL6}$ 636 are applied in parallel or simultaneously to the transistors 660, 663 and 666, respectively.

Double-side-bias (Vd/Vs) programming is applied to selected charge trapping memory cells or transistors (e.g., 660, 663, 666)) with a DSB-MLC operation. The transistor 660 includes a first charge trap site 661 connected to the first bit line 621 and a second charge trap site 662 connected to the fourth bit line 624. The first bit line 621 is applied with the first bit line voltage $V_{BL1}$ 631 of 5.5 volts in a first direction 691, which is supplied to the first charge trap site 661 of the transistor 660. The fourth bit line 624 is applied with the fourth bit line voltage $V_{BL4}$ 634 of 5.5 volts in a fourth direction 694, which is supplied to the second charge trap site 662 of the transistor 660. The transistor 663 includes a first charge trap site 666 connected to the second bit line 622 and a second charge trap site 667 connected to the fifth bit line 635. The second bit line is applied with the second bit line voltage $V_{BL2}$ 632 of 5.0 volts in a second direction 692, which is supplied to the first charge trap site 664 of the transistor 663. The fifth bit line 625 is applied with the fifth bit line voltage $V_{BL5}$ 635 of 5.0 volts in a fifth direction 695, which is supplied to the second charge trap site 665 of the transistor 663. The transistor 666 includes a first charge trap site 667 connected to the third bit line 623 and a second charge trap site 668 connected to the sixth bit line 626. The third bit line 623 is applied with the third bit line voltage $V_{BL3}$ 633 of 4.5 volts in a third direction 693, which is supplied to the first charge trap site 667 of the transistor 666. The sixth bit line 626 is applied with the sixth bit line voltage $V_{BL6}$ 636 of 4.5 volts in a sixth direction 696, which is supplied to the second charge trap site 668 of the transistor 666.

Word lines 610, 614 are not selected in this example. A word line voltage $V_{WL1}$ 611 is applied to the word line 610, where $V_{WL1}$ 611 is equal to a pass voltage Vpass. The Vpass voltage is a voltage value greater than a program voltage threshold voltage in order to turn on a transistor device. Similarly, a word line voltage $V_{WL32}$ 615 is applied to the word line 614, where $V_{WL32}$ 615 is equal to the pass voltage Vpass. A bit line transistor voltage $V_{BLT}$ 617 is applied to word line 616. A bit line transistor voltage $V_{BLT}$ 619 is applied to the word line 618. Each of the bit line transistor voltages, $V_{BLT}$ 617 and $V_{BLT}$ 619, is equal to the word line voltage $V_{WL16}$ 613 in this illustration.

Figure 7:
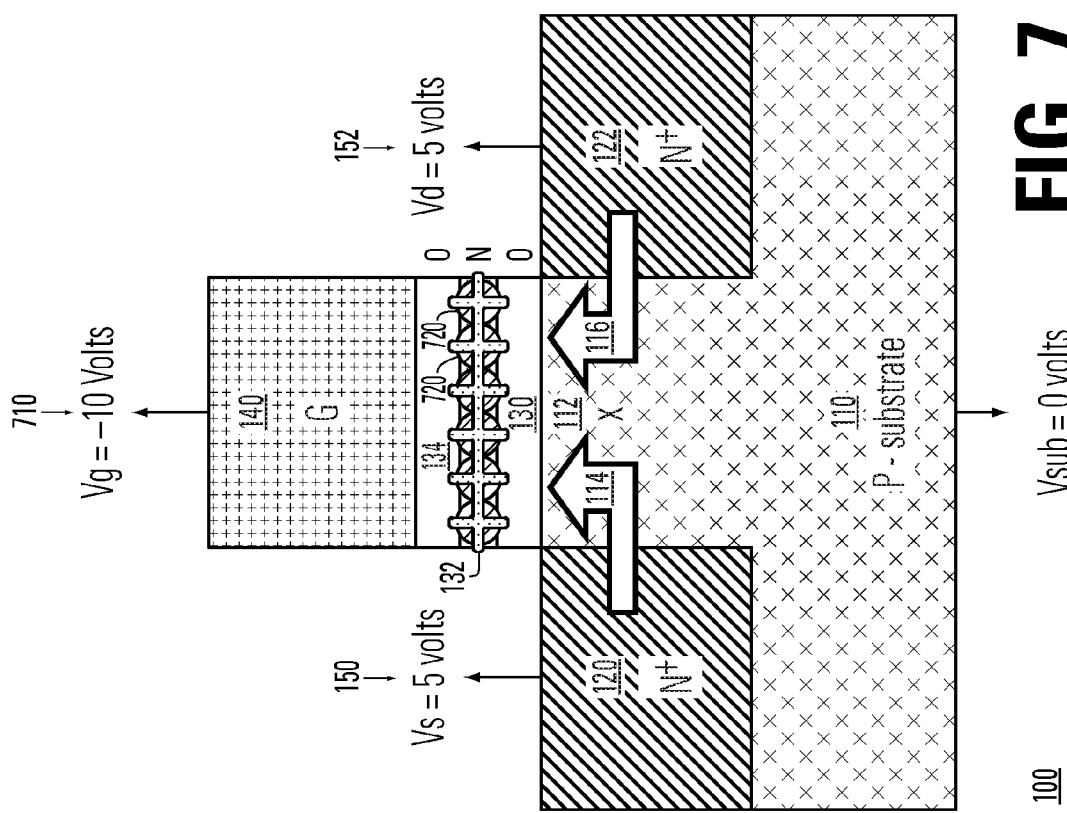
FIG. 7 is a process diagram illustrating a cross-sectional view of erasing a charge trapping memory cell by a double-side-bias hole injection method in accordance with the present invention.

FIG. 7 is a process diagram illustrating a cross-sectional view of erasing a charge trapping memory cell 100 using a double-side-bias hole injection (HI) method. The charge trapping cell 100 is also applied using the double-side-bias by applying the same voltages to the source region 120 and the drain region 122. The source voltage Vs 150 of 5 volts is applied to the source region 120. A first directional flow 114 indicates the flow of electron charges from the n+ doped region 120, and a second directional flow 116 indicates the flow? of hole charges from the n+ doped region 122. The drain voltage Vd 152 of 5 volts is applied to the drain region 122. In a hole injection method, a negative gate voltage −Vg 710 of −10 volts is applied to the polygate 140 to enhance the hole injection efficiency. Hole charges 720 can be generated with a junction voltage, which is used to control hole generation efficiency.

Figure 8:
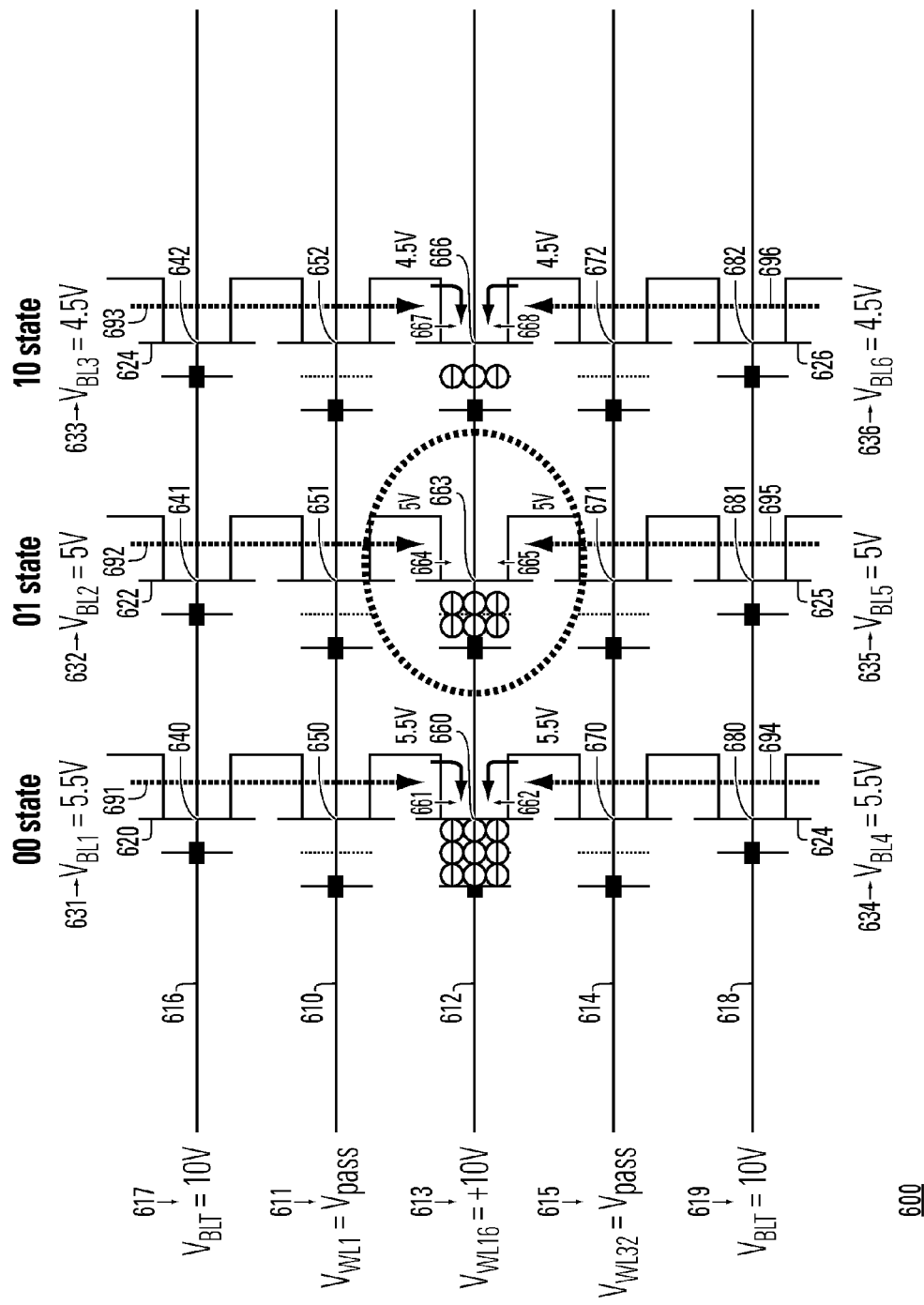
FIG. 8 is a circuit diagram illustrating a first step in a DSB-MLC bit-by-bit erase method of a NAND array by checking which bit or bits have been over-programmed where one or more over-programmed bits are erased in accordance with the present invention.

FIG. 8 is a circuit diagram illustrating a first step in a DSB-MLC bit-by-bit erase method of an NAND array by checking which bit or bits have been over-programmed where one or more over-programmed bits are erased. In a conventional approach, an NAND operation is executed by performing selective programming and non-selective erase (also referred to as chip-erase). Embodiments of the present method include selective program and selective erase by a DSB method operation of an NAND memory. The term "bit-by-bit" erase method refers to instances where a particular bit is selected for erase rather than selecting an entire chip to erase.

In this illustration, the charge trapping memory cell 633 in the logic 01 state has been over-programmed, exceeding the intended programming Vt level. The term "over-program" is defined to mean that the program voltage threshold Vt is a larger value than a target voltage threshold Vt. For example, the following logic states have voltage characteristics as follow: a logic 11-state with Vt=−2V, a logic 10-state with Vt=1V, a logic 01-state with Vt=4V and a logic 00-state with Vt=7V. Given that the parameter Vt produces a distribution, it is necessary to define a target for tolerating a program voltage threshold Vt distribution. The target for each memory state could be −1.5V, 1.5V, 4.5V and 7.5V, respectively, with a 0.5V buffer. Therefore, a logic 10-state with Vt=2V (>1.5V) means an over-program state. The over-programming to a charge trapping memory cell can occur in one of the following scenarios: over-programming in the first charge trap site 664, or over-programming in the second charge trap site 665, or over-programming both the first and second charge trap sites 664, 665. Although the illustration in FIG. 8 shows just one over-programmed charge trapping memory cell, additional charge trapping memory cells could be determined to have been over-programmed in other illustrations.

Figure 9:
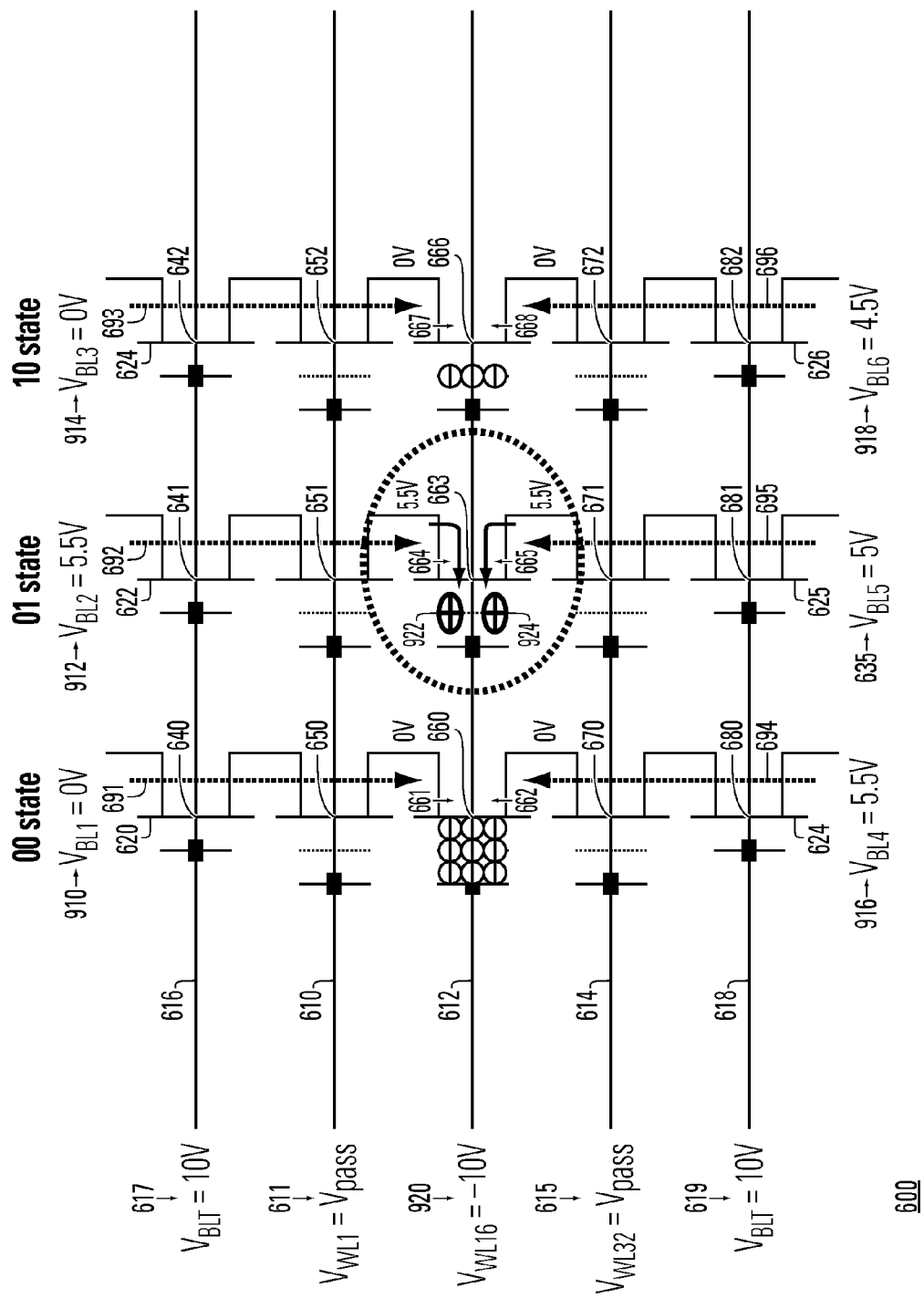
FIG. 9 is a circuit diagram illustrating a second step in a DSB-MLC bit-by-bit erase method of the NAND array by erasing the one or more programmed bits where only the over-programmed bits are erased in accordance with the present invention.

FIG. 9 is a circuit diagram illustrating a second step in a DSB-MLC bit-by-bit erase method of a NAND array by erasing the one or more programmed bits where only the over-programmed bits are erased. Following the first step in FIG. 8, after determining that the first charge trapping site 664 in the charge trapping memory cell 663 in the logic 01 state has been over-programmed, the second bit line voltage $V_{BL2}$ is applied with 5.5 volts to erase the charge trapping memory cell 663, and a word line voltage (or a gate voltage) 920 of −10 volts is applied to a gate terminal of the charge trapping transistor 663. If the first charge trapping site 664 in this example represents a drain region, the DSB-Vd is applied to the selected cell, i.e. the charge trapping memory cell 663, with DSB-HI erase operation. The erase operation involves only the selected over-programmed bit or bits that are erased. The fifth bit line voltage $V_{BL5}$ 635 remains at 5 volts given that the second charge trapping site 665 in the charge trapping memory cell 663 has not been over-programmed. Other bit line voltages, $V_{BL1}$ 910, $V_{BL3}$ 914, $V_{BL4}$ 916, $V_{BL6}$ 918, are applied with zero volts.

For non-selected word lines 610, 614, the word line voltage $V_{WL1}$ 611 is applied to the word line 610, where $V_{WL1}$ 611 is equal to a pass voltage Vpass. The Vpass voltage is a voltage value greater than a program voltage threshold voltage in order to turn on a transistor device. Similarly, the word line voltage V615 is applied to the word line 614, where $V_{WL32}$ 615 is equal to the pass voltage Vpass.

Figure 10:
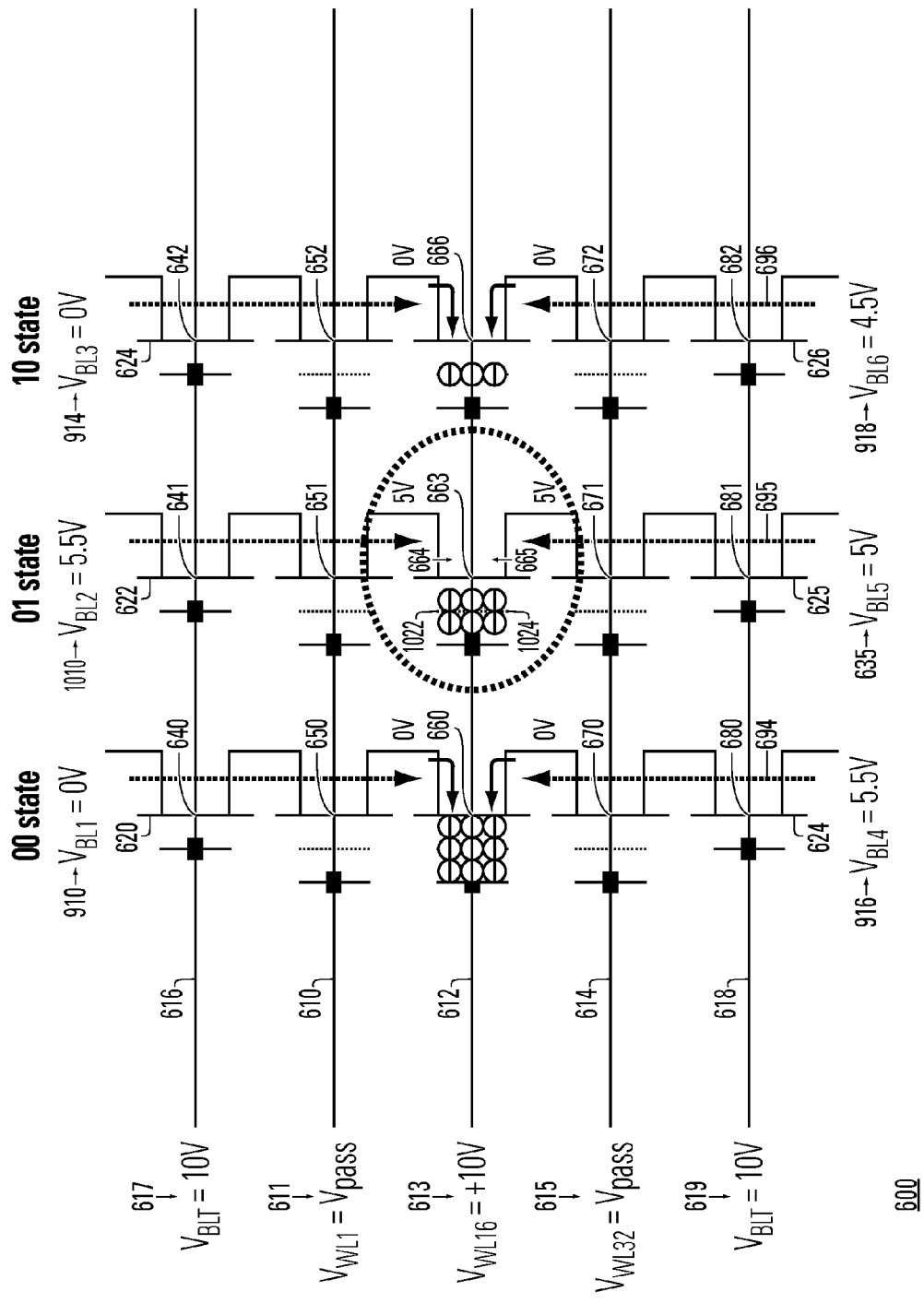
FIG. 10 is a circuit diagram illustrating a third step in a DSB-MLC bit-by-bit erase method of the NAND array for reprogramming the selected bit or bits wherein only the selected bit or bits are reprogrammed in accordance with the present invention

FIG. 10 is a circuit diagram illustrating a third step in a DSB-MLC bit-by-bit erase method of a NAND array for reprogramming the selected bit or bits wherein only the selected bit or bits are reprogrammed. Following the second step as described with respect to FIG. 9, which erases the selected over-programmed charge trapping memory cell 663 by a DSB-HI method, the charge trapping memory cell 663 in the logic 01 state is reprogrammed with bias condition of 01 state. (Vg=10V, Vd/Vs=5V)

The invention has been described with reference to specific exemplary embodiments. For example, the charge storage structures in the present invention are applicable to any type or variations of a charge trapping memory including both n-channel and p-channel SONOS types of devices and floating gate memory. In addition, although the charge trapping memory cell is illustrated with four logic states in a multi-level-cell application, other variations of $2^n$ MLC applications can be practiced without departing from the spirit of the present invention. Accordingly, the specification and drawings are to be regarded as illustrative of the principles of this invention rather than restrictive; the invention is defined by the following appended claims.

I claim:

1. A method of biasing a multi-level-cell (MLC) memory device having a plurality of charge trapping memory cells in a memory array, each charge trapping memory cell in the plurality of charge trapping memory cells having $2^n$ logic states including a first logic state, a second logic state, a third logic state, a fourth logic state, each charge trapping memory cell having a first charge trapping site for storing a first bit and a second charge trapping site for storing a second bit, comprising:

programming the plurality of charge trapping memory cells by simultaneously biasing a respective source terminal and a respective drain terminal in each of the plurality of charge trapping memory cells and applying a gate voltage to a respective terminal in each of the plurality of charge trapping memory cells;

determining a bit in each of the plurality of charge trapping memory cells that has been over-programmed by reading a voltage value of the bit and comparing with a reference voltage value, the over-programmed bit having a source terminal, a drain terminal and a gate terminal;

erasing the over-programmed bit by biasing simultaneously the source terminal and the drain terminal of the over-programmed bit; and reprogramming the over-programmed bit that is erased during the erasing operation.

2. The method of claim 1, wherein the programming step comprises:

simultaneously biasing the respective source terminal with a first source voltage and the respective drain terminal with a first drain voltage, and applying the gate voltage to the respective gate terminal for each charge trapping memory cell in the first logic state, simultaneously biasing the respective source terminal with a second source voltage and the respective drain terminal with a second drain voltage, and applying the gate voltage to the respective gate terminal for each charge trapping memory cell in the second logic state;

simultaneously biasing the respective source terminal with a third source voltage and the respective drain terminal with a third drain voltage, and applying the gate voltage to the respective gate terminal for each charge trapping memory cell in the third logic state; and simultaneously biasing the respective source terminal with a fourth source voltage and the respective drain terminal with a fourth drain voltage, and applying the gate voltage to the respective gate terminal for each charge trapping memory cell in the fourth logic state;

wherein the gate voltage is a constant voltage value, the first source voltage and the first drain value are a same voltage that is larger than the second source voltage and the second drain voltage, the second source voltage and the second drain value are a same voltage that is larger than the third source voltage and the third drain voltage, the third source voltage and the third drain value are a same voltage that is larger than the fourth source voltage and the fourth drain voltage.

3. The method of claim 1, wherein the programming step comprises:

simultaneously biasing the respective source terminal with a source voltage and the respective drain terminal with a drain voltage, and applying a first gate voltage to the respective gate terminal for each charge trapping memory cell in the first logic state, simultaneously biasing the respective source terminal with the source voltage and the respective drain terminal with the drain voltage, and applying a second gate voltage to the respective gate terminal for each charge trapping memory cell in the second logic state;

simultaneously biasing the respective source terminal with the source voltage and the respective drain terminal with the drain voltage, and applying a third gate voltage to the respective gate terminal for each charge trapping memory cell in the third logic state; and simultaneously biasing the respective source terminal with the source voltage and the respective drain terminal with the drain voltage, and applying a fourth gate voltage to the respective gate terminal for each charge trapping memory cell in the fourth logic state.

4. The method of claim 1, wherein the source voltage is about the same as the drain voltage.

5. The method of claim 1, after the erasing step, further comprising reprogramming the over-programmed bit by biasing simultaneously the source terminal and the drain terminal of the over-programmed bit, and biasing the gate terminal of the over-programmed bit with a positive gate voltage.

6. The method of claim 1, wherein each charge trapping memory cell comprises a first charge trapping site and a second charge trapping site, the first charge trapping site for storing the first bit and a third bit, the second charge trapping site for storing the second bit and a fourth bit.

7. The method of claim 1, wherein the programming step comprises an electron injection technique.

8. The method of claim 1, wherein the erasing step comprises a hole injection technique.

9. The method of claim 1, wherein the memory array comprises a NAND memory array.

10. A method of biasing a multi-level-cell (MLC) memory device having a plurality of charge trapping memory cells in a memory array, each charge trapping memory cell having a first charge trapping site for storing a first bit and a second charge trapping site for storing a second bit, the combination of the first and second bits providing a first multi-level-cell state, a second multi-level-cell state, a third multi-level-cell state, a fourth multi-level-cell state, comprising:

programming the plurality of charge trapping memory cells by simultaneously biasing a respective source terminal and a respective drain terminal in each charge trapping memory cell and applying a gate voltage to a respective terminal in each charge trapping memory cell;

determining a bit in each charge trapping memory cell of the plurality of charge trapping memory cells that has been over-programmed by reading a voltage value of the bit and comparing with a reference voltage value, the over-programmed bit having a source terminal, a drain terminal and a gate terminal;

erasing the over-programmed bit by biasing simultaneously the source terminal and the drain terminal of the over-programmed bit in the selected charge trapping memory cell; and reprogramming the over-programmed bit that is erased during the erasing operation.

11. The method of claim 10, wherein the programming step comprises:

simultaneously biasing the respective source terminal with a first source voltage and the respective drain terminal with a first drain voltage, and applying the gate voltage to the respective gate terminal for each charge trapping memory cell in the first multi-level-cell state, simultaneously biasing the respective source terminal with a second source voltage and the respective drain terminal with a second drain voltage, and applying the gate voltage to the respective gate terminal for each charge trapping memory cell in the second multi-level-cell state;

simultaneously biasing the respective source terminal with a third source voltage and the respective drain terminal with a third drain voltage, and applying the gate voltage to the respective gate terminal for each charge trapping memory cell in the third multi-level-cell state; and simultaneously biasing the respective source terminal with a third source voltage and the respective drain terminal with a fourth drain voltage, and applying the gate voltage to the respective gate terminal for each charge trapping memory cell in the fourth multi-level-cell state;

wherein the gate voltage is a constant voltage value, the first source voltage and the first drain value are a same voltage that is larger than the second source voltage and the second drain voltage, the second source voltage and the second drain value are a same voltage that is larger than the third source voltage and the third drain voltage, the third source voltage and the third drain value are a same voltage that is larger than the fourth source voltage and the fourth drain voltage.

12. The method of claim 10, wherein the programming step comprises:

simultaneously biasing the respective source terminal with a source voltage and the respective drain terminal with a drain voltage, and applying a first gate voltage to the respective gate terminal for each charge trapping memory cell in the first multi-level-cell state, simultaneously biasing the respective source terminal with the source voltage and the respective drain terminal with the drain voltage, and applying a second gate voltage to the respective gate terminal for each charge trapping memory cell in the second multi-level-cell state;

simultaneously biasing the respective source terminal with the source voltage and the respective drain terminal with the drain voltage, and applying a third gate voltage to the respective gate terminal for each charge trapping memory cell in the third multi-level-cell state; and simultaneously biasing the respective source terminal with the source voltage and the respective drain terminal with the drain voltage, and applying a fourth gate voltage to the respective gate terminal for each charge trapping memory cell in the fourth multi-level-cell state.

13. The method of claim 10, wherein the source voltage is about the same as the drain voltage.

14. The method of claim 10, after the erasing step, further comprising reprogramming the over-programmed bit by biasing simultaneously the source terminal and the drain terminal of the over-programmed bit, and biasing the gate terminal of the over-programmed bit with a positive gate voltage.

15. The method of claim 10, wherein each charge trapping memory cell comprises a first charge trapping site and a second charge trapping site, the first charge trapping site for storing the first bit and a third bit, the second charge trapping site for storing the second bit and a fourth bit.

16. The method of claim 10, wherein the programming step comprises an electron injection technique.

17. The method of claim 10, wherein the erasing step comprises a hole injection technique.

18. The method of claim 10, wherein the memory array comprises a NAND memory array.

* * * * *